US006551408B2

United States Patent
Fujimura

(10) Patent No.: US 6,551,408 B2
(45) Date of Patent: Apr. 22, 2003

(54) METHOD OF AND SYSTEM FOR CLEANING PROBES

(75) Inventor: Naoyuki Fujimura, Tokyo (JP)

(73) Assignee: Ando Electric Co., Ltd., Tokyo (JP)

( * ) Notice: Subject to any disclaimer, the term of this patent is extended or adjusted under 35 U.S.C. 154(b) by 171 days.

(21) Appl. No.: 09/826,082

(22) Filed: Apr. 4, 2001

(65) Prior Publication Data

US 2001/0035196 A1 Nov. 1, 2001

(30) Foreign Application Priority Data

Apr. 28, 2000 (JP) ........................... 2000-131863

(51) Int. Cl.⁷ .................................................. B08B 3/12
(52) U.S. Cl. ............................. 134/1; 134/2; 134/25.1; 134/184; 34/422
(58) Field of Search ............................. 134/1, 2, 25.1, 134/34, 104.2, 184, 105, 56 R; 347/68; 34/422

(56) References Cited

U.S. PATENT DOCUMENTS

| 4,111,546 A | * | 9/1978 | Maret ........................... 399/349 |
| 4,395,719 A | * | 7/1983 | Majewski et al. ............. 347/68 |
| 5,316,591 A | * | 5/1994 | Chao et al. .................... 134/34 |
| 6,039,059 A | * | 3/2000 | Bran ........................... 134/105 |
| 6,308,436 B1 | * | 10/2001 | Stipp ........................... 34/422 |
| 6,474,350 B1 | * | 11/2002 | Mizuta et al. ............ 134/56 R |

FOREIGN PATENT DOCUMENTS

| JP | 2000-046871 | 2/2000 |
| JP | 2000-124247 | 4/2000 |

\* cited by examiner

*Primary Examiner*—Randy Gulakowski
*Assistant Examiner*—Gentle Winter
(74) *Attorney, Agent, or Firm*—Flynn, Thiel, Boutell & Tanis, P.C.

(57) ABSTRACT

The invention provides a method of cleaning probes, capable of simplifying a cleaning process without causing a damage to the probes, and a cleaning system for use in carrying out the method. A cylindrical body supported so as to be opposed to a probe card with probes formed thereon is provided with an ultrasonic vibrator and an ultrasonic wave generation device for causing the ultrasonic vibrator to undergo ultrasonic vibration. By causing the ultrasonic vibrator to undergo ultrasonic vibration by the agency of the ultrasonic wave generation device, a standing wave comprising nodes and antinodes occurring in concentric circles is generated inside the cylindrical body. In such a state, the cylindrical body is caused to make relative translation against the probe card such that the respective antinodes of the standing wave are caused to travel in sequence so as to coincide with a position of the respective probes, so that foreign particles stuck to the surface of the respective probes are removed through a non-contact method due to vibration of air.

7 Claims, 5 Drawing Sheets

METHOD OF AND SYSTEM FOR CLEANING PROBES

BACKGROUND OF THE INVENTION

1. Field of the Invention

The present invention relates to a method of cleaning probes fitted to a probe card for use in an electrical continuity test for a plurality of semiconductor integrated circuit devices formed on a semiconductor wafer, and so forth, and a cleaning system for use in carrying out the method.

2. Related Art

In the case of conducting an electrical continuity test for a plurality of semiconductor integrated circuit devices formed on a semiconductor wafer, a probe card provided with a plurality of probes fitted thereto is generally used.

When conducting the electrical continuity test, the probe card is used to cause the tip of the respective probes to come into contact with respective electrodes composed of aluminum, and the like, formed on the surface of the respective semiconductor integrated circuit devices.

Hereupon, as a thin oxide film is formed on the surface of the respective electrodes, the respective probes are set to be slidably in contact with the respective electrodes in order to remove the oxide film at the time of the contact with the respective electrodes. As a result, foreign particles composed of powders of metal such as aluminum, and the like, making up the electrodes, are caused to adhere to the surface of the respective probes.

Consequently, there has arisen a problem that electrical conductivity of the respective probes deteriorates due to the oxide film of the metal, adhered to the surface of the respective probes, and faulty contact between the respective electrodes and the respective probes results, making it impossible to conduct the electrical continuity test in a satisfactory manner. Accordingly, cleaning of the probe card has thus far been carried out in order to remove the foreign particles adhered to the surface of the respective probes.

Now, a conventional method of cleaning the probes is described hereinafter with reference to FIG. 5. In FIG. 5, reference numeral 110 denotes one of the probes making up the probe card, 111 the foreign particles, 120 an abrasive sheet, 121 abrasive grains contained inside the abrasive sheet 120, and 122 a sheet base material made of a silicone rubber.

In cleaning the probe 110 with the use of the abrasive sheet 120, there has been adopted a practice whereby the probe 110 is caused to pierce the abrasive sheet 120 several times, and the foreign particles 111 adhered to the probe 110 are scraped off by the agency of the abrasive grains 121 contained inside the abrasive sheet 120.

With such a method as described, however, a film of silicone rubber, a constituent material of the sheet base material 122, adheres to the probe 110, so that it has been necessary to apply an organic solvent to the probe 110 for removal of the film of silicone rubber, and further, to blow air thereto for drying the organic solvent.

Thus, with the conventional method of cleaning the probes, there are involved many steps of a cleaning process, such as scraping off of the foreign particles, application of the organic solvent, and the blowing of air, causing a problem that significant effort and time are required in carrying out these steps.

Further, since the organic solvent is used in the step of applying the organic solvent, a working environment has been anything but desirable to workers.

Furthermore, since the probe 110 is caused to pierce the abrasive sheet 120 to come into contact therewith, there has been a risk of the probe 110 undergoing deformation.

SUMMARY OF THE INVENTION

The present invention has been developed in view of such a circumstance as described in the foregoing, and it is therefore an object of the invention to provide a method of cleaning probes, capable of attaining reduction in the number of steps for a process of cleaning the probes, improvement in a cleaning environment, and less damage inflicted on the probes, and a cleaning device used for carrying out the method.

To this end, according to a first aspect of the invention, there is provided a method of cleaning a probe for removing foreign particles stuck to the probe, comprising the steps of: causing a standing wave comprising nodes and antinodes occurring in concentric circles to be generated inside a cylindrical body by subjecting the cylindrical body to ultrasonic vibration, and removing the foreign particles stuck to the surface of the probe by vibration of air occurring at the antinodes of the standing wave generated inside the cylindrical body by bringing the cylindrical body in close proximity to the probe.

Thus, since the foreign particles stuck to the surface of the probe are removed without contact by the effect of vibration of air occurring at the antinodes of the standing wave generated inside the cylindrical body by subjecting the cylindrical body to the ultrasonic vibration, it becomes possible to do away with troublesome work, which otherwise is required later on, such as removal of a film of silicone rubber by use of an organic solvent, work for drying the organic solvent by blowing air thereto, and so forth, thereby enabling simplification of work and shortening of work time as compared with a conventional case where the foreign particles are scraped off by causing the probe to pierce the abrasive sheet containing the abrasive grains. Further, since the organic solvent is unwanted, degradation in a working environment can be prevented. Furthermore, since the probe is cleaned by a non-contact method, cleaning can be carried out without causing problems such as deformation of the probe due to contact.

That is, excellent cleaning can be performed without inviting damage on the probe, and degradation in a working environment, which can otherwise occur at the time of cleaning, while reducing the number of steps for the process of cleaning the probe.

According to a second aspect of the invention, there is provided the method of cleaning the probe as set forth in the first aspect of the invention, wherein the cylindrical body is caused to undergo ultrasonic vibration at a plurality of varieties of resonance frequencies thereof.

That is, by causing the cylindrical body to undergo the ultrasonic vibration at the plurality of the varieties of resonance frequencies thereof, a plurality of varieties of standing waves are caused to be generated, and consequently, the number of nodes and antinodes of the standing waves generated inside the cylindrical body can be increased, thereby enabling cleaning of a plurality of the probes with ease.

As a result, a probe card comprising the plurality of the probes, for use in an electrical continuity test for a plurality of semiconductor integrated circuit devices, and so forth, can be cleaned with extreme ease and in short time.

That is, it becomes possible to significantly enhance a probability of the antinodes of the standing waves coinciding with a position of the respective probes so as to be able to cope with a tendency of a pitch among the probes becoming narrower accompanying narrowing down of a pitch among electrodes formed on the semiconductor integrated circuit devices, and a tendency of an increase in the number of the probes fitted to the probe card for application to a wafer in whole.

According to a third aspect of the invention, there is provided the method of cleaning the probe as in the first aspect or the second aspect of the invention, wherein the plurality of the probes are disposed so as to be arranged in line, and the cylindrical body is caused to make relative translation in the direction of a lineup of the probes as arranged.

More specifically, by causing the cylindrical body to make the relative translation in the direction of the lineup of the probes of the probe card provided with the plurality of the probes lined up, for use in conducting the electrical continuity test on the semiconductor integrated circuit devices, and the like, the foreign particles stuck to the respective probes can be removed smoothly and in short time by the agency of the standing waves generated inside the cylindrical body.

According to a fourth aspect of the invention, there is provided a cleaning system for cleaning probes so as to remove foreign particles stuck to the probes, comprising a cylindrical body, an ultrasonic vibrator installed in the cylindrical body, and an ultrasonic wave generation device for causing the ultrasonic vibrator to undergo ultrasonic vibration, wherein by causing the ultrasonic vibrator to undergo the ultrasonic vibration by the agency of the ultrasonic wave generation device, standing waves are caused to be generated in the cylindrical body, thereby removing the foreign particles stuck to the surface of the probes by the effect of vibration of air occurring at the anti nodes of the standing waves.

Thus, with the cleaning system for cleaning the probes as described above, the foreign particles stuck to the surface of the probes are removed without contact by the effect of vibration of air occurring at the antinodes of the standing waves generated inside the cylindrical body by subjecting the cylindrical body to the ultrasonic vibration, and consequently, it becomes possible to do away with the troublesome work, which otherwise is required later on, such as removal of the film of silicone rubber by use of the organic solvent, work for drying the organic solvent by blowing air thereto, and so forth, thereby enabling simplification of work and shortening of work time as compared with the conventional case where the foreign particles are scraped off by causing the probes to pierce the abrasive sheet containing the abrasive grains. Further, since the organic solvent is unwanted, degradation in a working environment can be prevented.

Furthermore, since the probes are cleaned through the non-contact method, cleaning can be carried out without causing problems such as deformation of the probes due to contact.

That is, excellent cleaning can be performed without inviting damage inflicted on the probes, and degradation in the working environment, which can otherwise occur at the time of cleaning, while reducing the number of steps for the process of cleaning the probes.

According to a fifth aspect of the invention, there is provided the cleaning system for cleaning the probes as in the fourth aspect of the invention, wherein the ultrasonic wave generation device comprises a plurality of ultrasonic wave generators for causing the ultrasonic vibrator to undergo ultrasonic vibration at the plurality of the varieties of resonance frequencies of the cylindrical body.

That is, by the agency of the plurality of the ultrasonic wave generators, the cylindrical body can be caused to undergo the ultrasonic vibration at the plurality of the varieties of resonance frequencies, and thereby a plurality of varieties of standing waves are caused to be generated inside the cylindrical body, increasing the number of nodes and antinodes of the standing waves, so that a plurality of the probes can be cleaned with ease.

Consequently, the probe card comprising the plurality of the probes, for use in the electrical continuity test for the plurality of the semiconductor integrated circuit devices, and so forth, can be cleaned with extreme ease and in short time.

That is, it becomes possible to significantly enhance a probability of the antinodes of the standing waves coinciding with a position of the respective probes so as to be able to cope with the tendency of the pitch among the probes becoming narrower accompanying narrowing down of the pitch among the electrodes formed on the semiconductor integrated circuit device, and the tendency of an increase in the number of the probes fitted to the probe card for application to a wafer in whole.

According to a sixth aspect of the invention, there is provided the cleaning system for cleaning the probes as in the fourth aspect of the fifth aspect of the invention, wherein the cylindrical body is formed in the shape of a cylinder closed at one end thereof with a bottom, is provided with the ultrasonic vibrator on the side of the bottom thereof, and is disposed such that an open side thereof is oriented toward the probes.

That is, by causing the ultrasonic vibrator installed on the bottom side of the cylindrical body to undergo the ultrasonic vibration by the agency of the ultrasonic wave generation device, the cylindrical body is caused to undergo the ultrasonic vibration with certainty, thereby enabling the standing waves to be generated inside the cylindrical body.

According to a seventh aspect of the invention, there is provided the cleaning system for cleaning the probes as in any of the fourth to sixth aspects of the invention, wherein a transfer means for causing the cylindrical body to relatively move in the direction of a lineup of the plurality of the probes arranged in line is provided.

That is, by causing the cylindrical body to make relative translation in the direction of the lineup of the probes, the plurality of the probes can be cleaned smoothly and in short time by the agency of the standing waves generated inside the cylindrical body.

PREFERRED EMBODIMENT OF THE INVENTION

A preferred embodiment of a method of cleaning probes, and a cleaning system for use in carrying out the method, according to the invention, will be described hereinafter with reference to the accompanying drawings.

Figure 1:
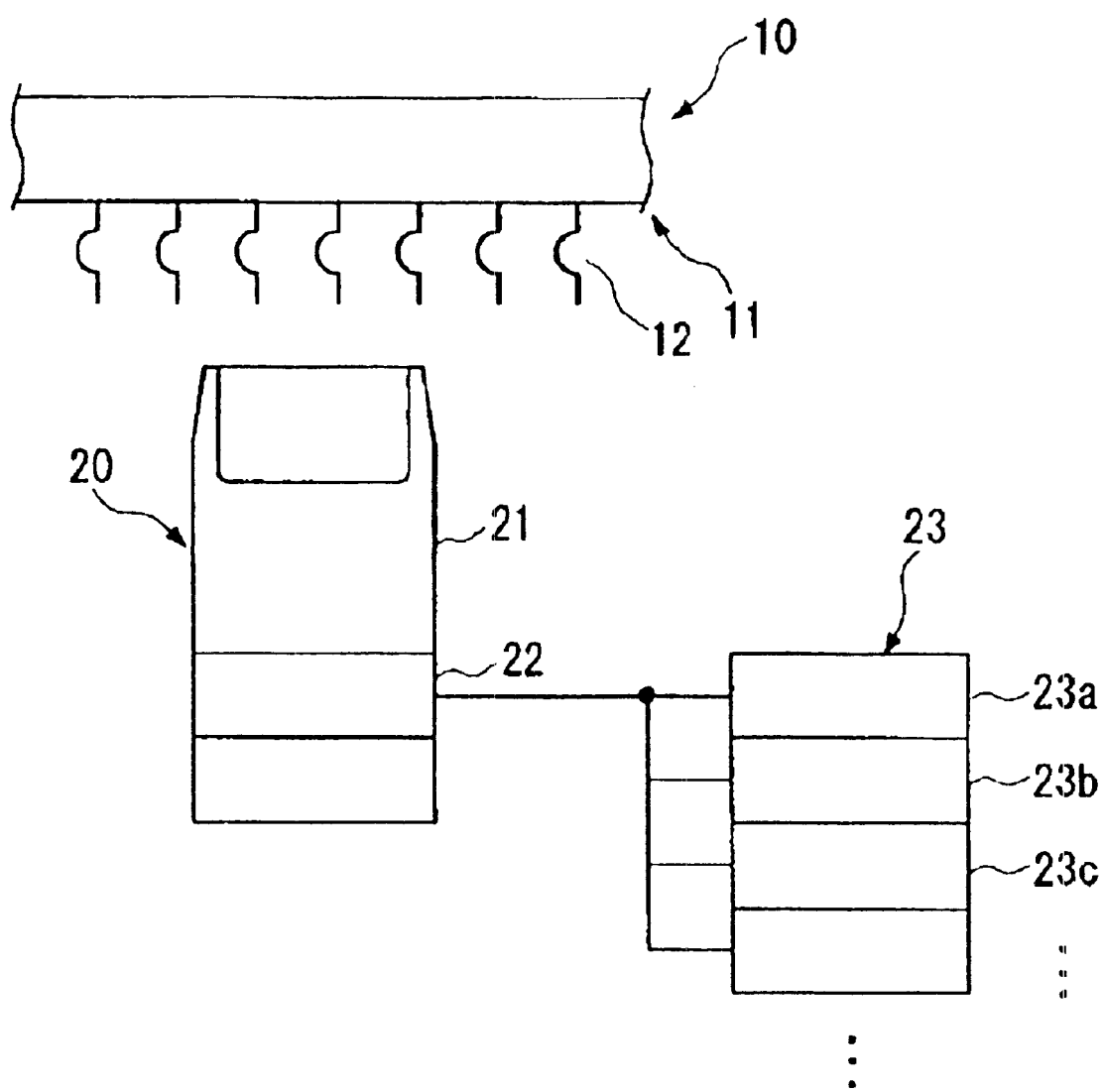
FIG. 1 is a schematic illustration showing a construction of a probe card used in carrying out an embodiment of a method of cleaning probes according to the invention.

In FIG. 1, reference numeral 10 denotes a probe card, 11 a probe forming face, and 12 probes. Further, reference numeral 20 denotes a cleaning device, 21 a cylindrical body, 22 an ultrasonic vibrator, and 23 an ultrasonic wave generation device comprising a plurality of ultrasonic wave generators 23a, 23b, 23c . . .

First, the probes 12 as objects for cleaning are described hereinafter.

The probes 12 are attached to the probe card 10 such that the tip of the respective probes 12 is at an identical distance from the probe forming face 11 of the probe card 10 so as to be arranged in line parallel with the probe forming face 11.

Further, the probe card 10 is installed such that the probes 12 are oriented downward, and the probe forming face 11 thereof is opposed to the cleaning device 20.

Subsequently, the cleaning device 20 is described hereinafter.

The cylindrical body 21 making up the cleaning device 20 is formed in the shape of a cylinder with a bottom, and is disposed such that an open side thereof is oriented toward the probe forming face 11 provided with the probes 12, disposed above the cylindrical body 21.

Further, a tip portion of the cylindrical body 21 is formed in a tapered shape with a diameter thereof gradually decreasing toward the extremity thereof, so that a wall thickness of the tip portion of the cylindrical body 21 is rendered gradually thinner toward the extremity thereof.

The cylindrical body 21 formed in the shape as described above is provided with the ultrasonic vibrator 22 on the bottom side thereof The plurality of the ultrasonic wave generators 23a, 23b, 23c . . . , making up the ultrasonic wave generation device 23, are connected to the ultrasonic vibrator 22 such that the ultrasonic vibrator 22 undergoes ultrasonic vibration at various frequencies by the agency of the ultrasonic wave generators 23a, 23b, 23c . . .

In this connection, a vibration frequency of the ultrasonic wave generators 23a, 23b, 23c . . . is set to an integral multiple of resonance frequencies of the cylindrical body 21.

Figure 2:
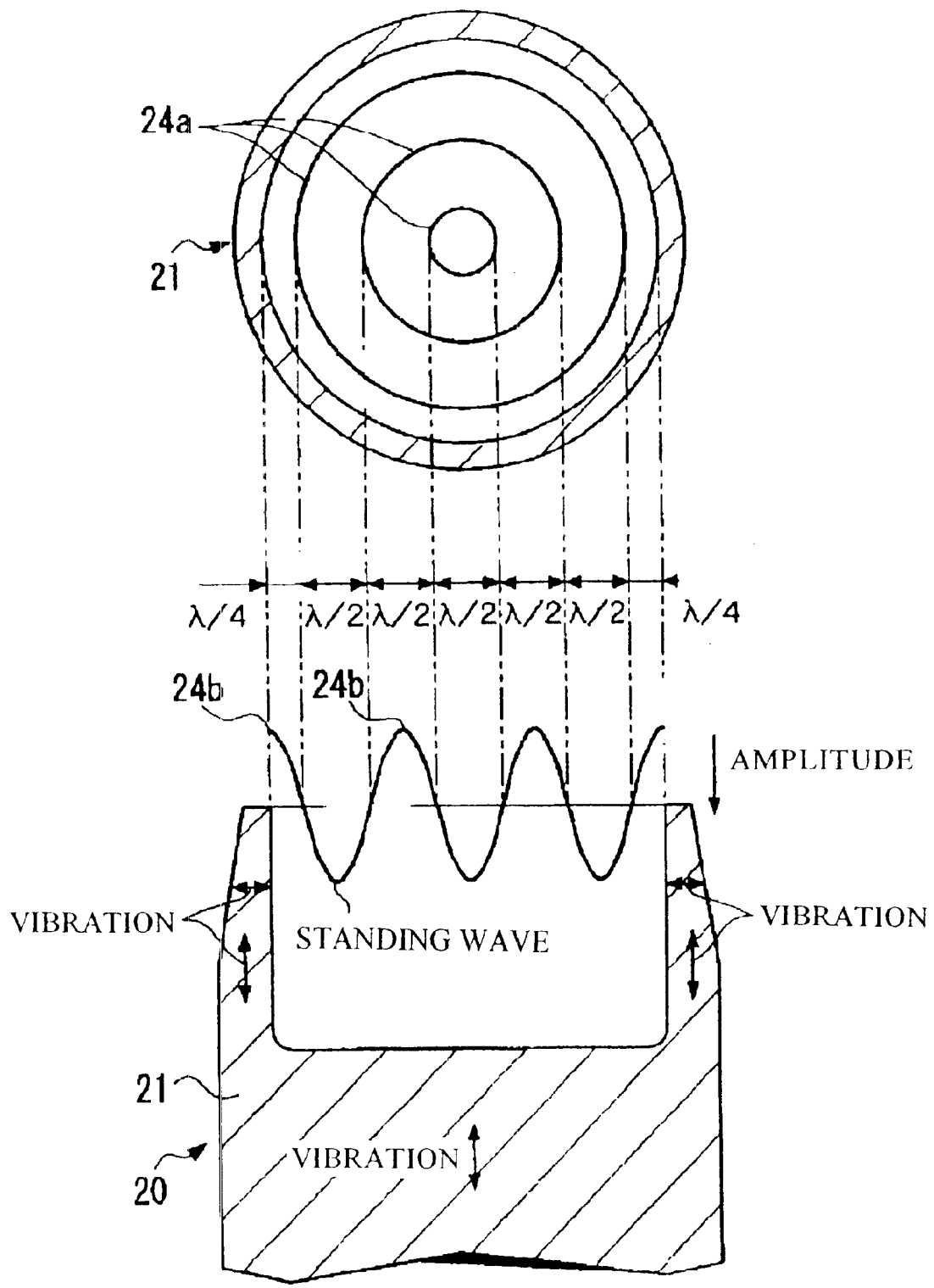
FIG. 2 is a schematic illustration showing a state of a standing wave occurring inside a cylindrical body of removal means for use in carrying out the embodiment of the method of cleaning the probes according to the invention.
Figure 3:
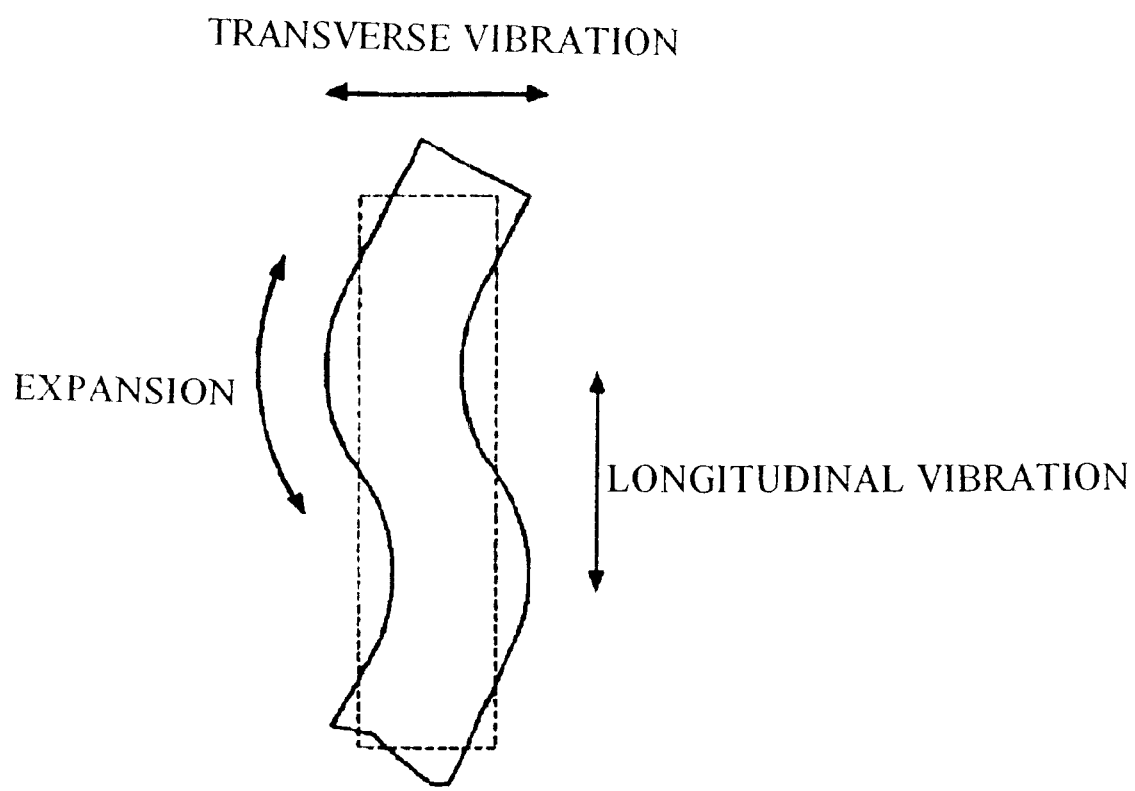
FIG. 3 is a schematic illustration showing a state of vibration of the cylindrical body of the removal means for use in carrying out the embodiment of the method of cleaning the probes according to the invention.

Now, a state of ultrasonic vibration occurring inside the cylindrical body 21 is described with reference to FIG. 2. FIG. 2 shows a sectional plan view of the cylindrical body 21, and amplitudes of the ultrasonic vibration, at a sectional face of the cylindrical body 21, along a line passing the center thereof. When the ultrasonic vibrator 22 is caused to undergo ultrasonic vibration at a resonance frequency, longitudinal vibration and transverse vibration are added to the cylindrical body 21 by the agency of an ultrasonic wave as shown in FIG. 3, thereby causing the cylindrical body 21 to expand and shrink in the radial direction thereof.

By setting an inside diameter of the cylindrical body 21 to an integral multiple of a wavelength $\lambda$ as determined by a frequency of the ultrasonic vibration and the sound velocity, a standing wave is caused to occur inside the cylindrical body 21, and nodes 24a of vibration appear in concentric circles.

The position of the outermost concentric circle lies at a distance of $\frac{1}{4}\lambda$ from the inner surface of the cylindrical body 21, and the concentric circles appear at intervals of every $\frac{1}{2}\lambda$ therefrom, rendering a diameter of the innermost concentric circle to be $\frac{1}{2}\lambda$. An antinode 24b of the vibration lies at a distance of $\frac{1}{4}\lambda$ from the respective nodes 24a, and air at the respective antinodes 24b undergoes vibration at the largest amplitude.

Further, the cleaning device 20 of the above-described construction is provided with a transfer means (not shown) inside the cylindrical body 21, so that the cleaning device 20 is caused to come in close proximity to or move away from the probe card 10, or caused to translate in parallel with the probe forming face 11 of the probe card 10 by the transfer means.

Subsequently, a case of cleaning the probes 12 of the probe card 10 by the cleaning device 20 is described hereinafter.

First, the cylindrical body 21 making up the cleaning device 20 is caused to undergo ultrasonic vibration by the agency of the ultrasonic wave generators 23a, 23b, 23c . . . of the ultrasonic wave generation device 23, thereby causing the standing wave to occur inside the cylindrical body 21.

Subsequently, the cylindrical body 21 of the cleaning device 20, in such a state as described above, is caused to move by the transfer means so as to come in close proximity to the probe card 10, and thereafter, is caused to relatively translate in parallel with the probe forming face 11 of the probe card 10.

Figure 4:
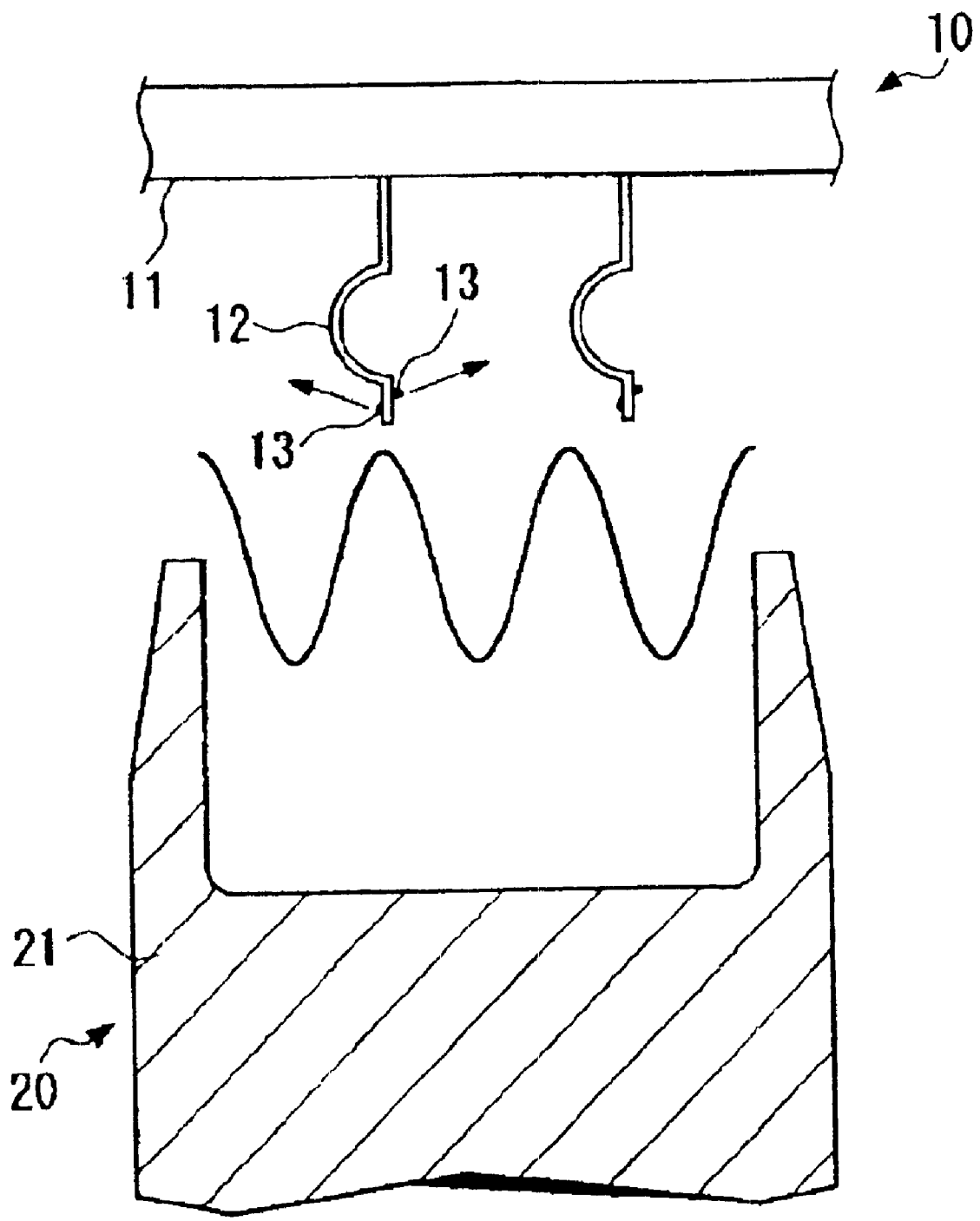
FIG. 4 is a schematic illustration showing a state of removing foreign particles stuck to the surface of the probes according to the embodiment of the method of cleaning the probes according to the invention.
Figure 5:
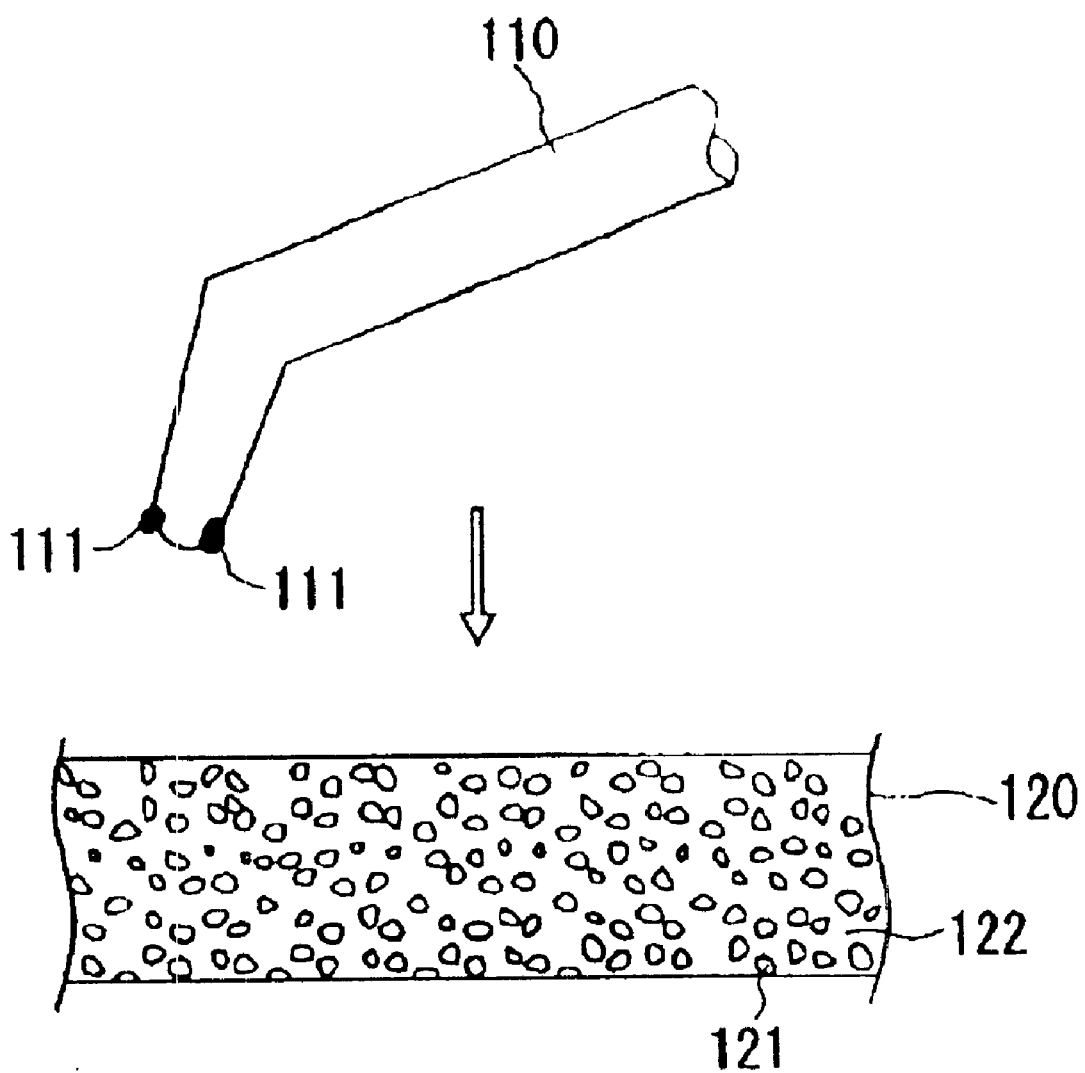
FIG. 5 is a schematic illustration showing a conventional method of cleaning probes.

As a result, as shown in FIG. 4, the respective antinodes 24b of the vibration of the standing wave occurring inside the cylindrical body 21 are caused to travel in sequence to a position of the respective probes 12, and foreign particles 13 stuck to the surface of the respective probes 12 are thereby removed without contact by vibration of air.

It is a well known fact that ultrasonic vibration is utilized for transfer of minuscule objects such as powders and removal of fine particles because the ultrasonic vibration has a high frequency of not lower than 20 kHz, thereby providing a high acceleration.

Thus, according to the above-described method of cleaning the probes, and the cleaning system for use in carrying out the method, the foreign particles 13 stuck to the surface of the respective probes 12 are removed without contact by vibration of air at the respective antinodes 24b of the standing wave occurring inside the cylindrical body 21 by subjecting the cylindrical body 21 to the ultrasonic vibration. Accordingly, as compared with the conventional case where foreign particles are scraped off by causing the respective probes to pierce the abrasive sheet containing the abrasive grains, it becomes possible to do away with troublesome work, which otherwise is required later on, such as removal of a film of silicone rubber by use of an organic solvent, work for drying the organic solvent by blowing air thereto, and so forth, thereby enabling simplification of work and shortening of work time. In addition, since the organic solvent is not required, degradation in a working environment can be prevented.

Furthermore, since the probes 12 are cleaned through a non-contact method, cleaning can be carried out without causing problems such as deformation of the probes 12 due to contact.

That is, excellent cleaning can be performed without inviting damage inflicted on the probes 12 of the probe card 10, and degradation in the working environment, which can otherwise occur at the time of cleaning, while reducing the number of steps for the process of cleaning the probes 12.

Further, by the agency of the plurality of the ultrasonic wave generators 23a, 23b, 23c . . . , it is possible to cause the cylindrical body 21 to undergo ultrasonic vibration at a plurality of varieties of resonance frequencies, and to thereby cause a plurality of varieties of standing waves to be generated inside the cylindrical body 21, enabling an increase in the number of nodes 24a and antinodes 24b of the standing waves, so that a plurality of the probes 12 can be cleaned with ease.

Consequently, the probe card 10 comprising the plurality of the probes 12, for use in an electrical continuity test for a plurality of semiconductor integrated circuit devices, and so forth, can be cleaned with extreme ease, and in short time.

That is, it becomes possible to significantly enhance a probability of the antinodes 24b of the standing waves coinciding with a position of the respective probes 12 so as to be able to cope with a tendency of a pitch among the probes 12 becoming narrower accompanying narrowing down of a pitch among electrodes formed on a semiconductor integrated circuit device, and a tendency of an increase in the number of the probes 12 fitted to the probe card 10 for application to a wafer in whole.

Further, by causing the cylindrical body 21 to make relative translation in the direction of a lineup of the probes 12 of the probe card 10 provided with the plurality of the probes 12 arranged in line, for use in conducting the electrical continuity test on semiconductor integrated circuit devices, and so forth, the foreign particles 13 stuck to the respective probes 12 can be removed smoothly and in short time by the agency of the standing waves occurring inside the cylindrical body 21.

Furthermore, by subjecting the ultrasonic vibrator 22 installed on the bottom side of the cylindrical body 21 to the ultrasonic vibration caused by the ultrasonic wave generation device 23, the cylindrical body 21 is caused to undergo the ultrasonic vibration with certainty, thereby enabling occurrence of the standing waves therein.

Still further, since the cylindrical body 21 has a tip portion thereof, formed in a tapered shape with a diameter thereof gradually decreasing toward the extremity thereof, an amplitude of the ultrasonic vibration at the tip portion is rendered extremely large, which allows driving current for causing the ultrasonic vibration of the cylindrical body 21 to be reduced, thereby enabling economical operation.

In the case of the embodiment described above, the probe card 10 is installed such that the probe forming face 11 thereof is oriented downward while the cylindrical body 21 of the cleaning device 20 is installed with the open side thereof, oriented upward, such that the probe forming face 11 of the probe card 10 is opposed thereto. However, the probe card 10 and the cylindrical body 21 may be disposed in an inverted position, respectively, provided that the probe forming face 11 is opposed to the open side of the cylindrical body 21.

As described hereinbefore, with the use of the method of cleaning the probes, and the cleaning system for use in carrying out the method, according to the invention, the following advantageous effects can be obtained.

With the method of cleaning a probe according to the first aspect of the invention, since the foreign particles stuck to the surface of the probe are removed without contact by the effect of vibration of air occurring at the antinodes of the standing wave generated inside the cylindrical body by subjecting the cylindrical body to the ultrasonic vibration, it becomes possible to do away with troublesome work, which otherwise is required later on, such as removal of a film of silicone rubber by use of an organic solvent, work for drying the organic solvent by blowing air thereto, and so forth, thereby enabling simplification of work and shortening of work time as compared with a conventional case where the foreign particles are scraped off by causing the probe to pierce the abrasive sheet containing the abrasive grains. Further, since the organic solvent is unwanted, degradation in a working environment can be prevented. Furthermore, since the probe is cleaned by a non-contact method, cleaning can be carried out without causing problems such as deformation of the probe due to contact.

That is, excellent cleaning can be performed without inviting damage on the probe, and degradation in a working environment, which can otherwise occur at the time of cleaning, while reducing the number of steps for the process of cleaning the probe.

With the method of cleaning a probe according to the second aspect of the invention, by causing the cylindrical body to undergo the ultrasonic vibration at the plurality of the varieties of resonance frequencies thereof, a plurality of varieties of standing waves are caused to be generated, and consequently, the number of nodes and antinodes of the standing waves generated inside the cylindrical body can be increased, thereby enabling cleaning of a plurality of the probes with ease.

As a result, a probe card comprising the plurality of the probes, for use in an electrical continuity test for a plurality of semiconductor integrated circuit devices, and so forth, can be cleaned with extreme ease and in short time.

That is, it becomes possible to significantly enhance a probability of the antinodes of the standing waves coinciding with a position of the respective probes so as to be able to cope with a tendency of a pitch among the probes becoming narrower accompanying narrowing down of a pitch among electrodes formed on the semiconductor integrated circuit devices, and a tendency of an increase in the number of the probes fitted to the probe card for application to a wafer in whole.

With the method of cleaning a probe according to the third aspect of the invention, by causing the cylindrical body to make the relative translation in the direction of the lineup of the probes of the probe card provided with the plurality of the probes lined up, for use in conducting the electrical continuity test on the semiconductor integrated circuit devices, and the like, the foreign particles stuck to the respective probes can be removed smoothly and in short time by the agency of the standing waves generated inside the cylindrical body.

With the cleaning system for cleaning probes according to the fourth aspect of the invention, since the foreign particles stuck to the surface of the probes are removed without contact by the effect of vibration of air occurring at the antinodes of the standing waves generated inside the cylindrical body by subjecting the cylindrical body to the ultrasonic vibration, and consequently, it becomes possible to do away with the troublesome work, which otherwise is required later on, such as removal of the film of silicone rubber by use of the organic solvent, work for drying the organic solvent by blowing air thereto, and so forth, thereby enabling simplification of work and shortening of work time as compared with the conventional case where the foreign particles are scraped off by causing the probes to pierce the abrasive sheet containing the abrasive grains. Further, since the organic solvent is unwanted, degradation in a working environment can be prevented.

Furthermore, since the probes are cleaned through the non-contact method, cleaning can be carried out without causing problems such as deformation of the probes due to contact.

That is, excellent cleaning can be performed without inviting damage inflicted on the probes, and degradation in the working environment, which can otherwise occur at the time of cleaning, while reducing the number of steps for the process of cleaning the probes.

With the cleaning system for cleaning probes according to the fifth aspect of the invention, by the agency of the plurality of the ultrasonic wave generators, the cylindrical body can be caused to undergo the ultrasonic vibration at the plurality of the varieties of resonance frequencies, and thereby a plurality of varieties of standing waves are caused to be generated inside the cylindrical body, increasing the number of nodes and antinodes of the standing waves, so that a plurality of the probes can be cleaned with ease.

Consequently, the probe card comprising the plurality of the probes, for use in the electrical continuity test for the plurality of the semiconductor integrated circuit devices, and so forth, can be cleaned with extreme ease and in short time.

With the cleaning system for cleaning probes according to the sixth aspect of the invention, by causing the ultrasonic vibrator installed on the bottom side of the cylindrical body to undergo the ultrasonic vibration by the agency of the ultrasonic wave generation device, the cylindrical body is caused to undergo the ultrasonic vibration with certainty, thereby enabling the standing waves to be generated inside the cylindrical body.

With the cleaning system for cleaning probes according to the seventh aspect of the invention, by causing the cylindrical body to make relative translation in the direction of the lineup of the probes, the plurality of the probes can be cleaned smoothly and in short time by the agency of the standing waves generated inside the cylindrical body.

What is claimed is:

1. A method of cleaning a probe for removing foreign particles stuck to the probe comprising the steps of:

causing a standing wave comprising nodes and antinodes occurring in concentric circles to be generated inside a cylindrical body by subjecting the cylindrical body to ultrasonic vibration; and removing the foreign particles stuck to the surface of the probe by vibration of air occurring at the antinodes of the standing wave generated inside the cylindrical body by bringing the cylindrical body in close proximity to the probe.

2. The method of cleaning a probe according to claim 1, wherein the cylindrical body is caused to undergo ultrasonic vibration at a plurality of varieties of resonance frequencies thereof.

3. The method of cleaning a probe according to claim 2, wherein the plurality of the probes are disposed so as to be arranged in line, and the cylindrical body is caused to make relative translation in the direction of a lineup of the probes as arranged.

4. A cleaning system for cleaning probes so as to remove foreign particles stuck to the probes comprising:

a cylindrical body, an ultrasonic vibrator installed in the cylindrical body, and an ultrasonic wave generation device for causing the ultrasonic vibrator to undergo ultrasonic vibration;

wherein by causing the ultrasonic vibrator to undergo the ultrasonic vibration by the agency of the ultrasonic wave generation device, standing waves are caused to be generated in the cylindrical body, thereby removing the foreign particles stuck to the surface of the probes by the effect of vibration of air occurring at the antinodes of the standing waves.

5. The cleaning system for cleaning the probes according to claim 4, wherein the ultrasonic wave generation device comprises a plurality of ultrasonic wave generators for causing the ultrasonic vibrator to undergo ultrasonic vibration at the plurality of the varieties of resonance frequencies of the cylindrical body.

6. The cleaning system for cleaning the probes according to claim 4 or 5, wherein the cylindrical body is formed in the shape of a cylinder closed at one end thereof with a bottom, is provided with the ultrasonic vibrator on the side of the bottom thereof, and is disposed such that an open side thereof is oriented toward the probes.

7. The cleaning system for cleaning the probes according to claims 4 or 5, wherein a transfer means for causing the cylindrical body to relatively move in the direction of a lineup of the plurality of the probes arranged in line is provided.

* * * * *